(12) United States Patent
Zhang et al.

(10) Patent No.: US 10,304,860 B2
(45) Date of Patent: May 28, 2019

(54) ARRAY SUBSTRATE AND METHOD OF FORMING THE SAME

(71) Applicant: Wuhan China Star Optoelectronics Technology Co., Ltd., Wuhan, Hubei (CN)

(72) Inventors: Chunqian Zhang, Guangdong (CN); Chao Wang, Guangdong (CN); Jingfeng Xue, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 246 days.

(21) Appl. No.: 15/023,379

(22) PCT Filed: Feb. 25, 2016

(86) PCT No.: PCT/CN2016/074527
§ 371 (c)(1),
(2) Date: Mar. 19, 2016

(87) PCT Pub. No.: WO2017/121012
PCT Pub. Date: Jul. 20, 2017

(65) Prior Publication Data
US 2018/0040632 A1 Feb. 8, 2018

(30) Foreign Application Priority Data
Jan. 11, 2016 (CN) .......................... 2016 1 0015061

(51) Int. Cl.
*H01L 21/77* (2017.01)
*H01L 27/12* (2006.01)
(Continued)

(52) U.S. Cl.
CPC .......... *H01L 27/124* (2013.01); *G02F 1/1368* (2013.01); *G02F 1/13454* (2013.01);
(Continued)

(58) Field of Classification Search
CPC ............... H01L 27/124; H01L 27/1262; H01L 29/41733; G02F 1/1368; G02F 1/136227; G02F 1/136209; G02F 1/136286
(Continued)

(56) References Cited

U.S. PATENT DOCUMENTS

| 2003/0103025 | A1* | 6/2003 | Kurokawa | ........... G09G 3/3648 345/87 |
| 2004/0257489 | A1 | 12/2004 | Gotoh et al. | |
| 2007/0058100 | A1* | 3/2007 | Ishii | ................... G02F 1/136213 349/43 |
| 2007/0170506 | A1* | 7/2007 | Onogi | ............... H01L 29/78609 257/347 |
| 2007/0210303 | A1 | 9/2007 | Ikeda et al. | |

(Continued)

FOREIGN PATENT DOCUMENTS

CN 103268876 A 8/2013
CN 105093738 A 11/2015
(Continued)

*Primary Examiner* — Thinh T Nguyen
(74) *Attorney, Agent, or Firm* — Andrew C. Cheng

(57) ABSTRACT

An array substrate includes a substrate, a buffer layer, a first shielding pattern, a passivation layer, a first semiconductor pattern, a gate insulating layer, a first gate pattern, an interlayer insulating layer, and two first source/drain electrode patterns. A first through hole and a second through hole are arranged on the array substrate. One of the first source/drain electrode patterns is electrically connected to the first semiconductor pattern and the first shielding pattern through the first through hole. The other one of the first source/drain electrode patterns is electrically connected to the first semiconductor pattern through the second through hole and is insulated from the first shielding pattern. The present invention where the array substrate and the method of forming the array substrate are proposed is related to a top-gate design. The driving ability of the TFT driving circuit still improves
(Continued)

without increasing the original processes and production costs.

7 Claims, 9 Drawing Sheets

(51) Int. Cl.
    *G02F 1/1362*     (2006.01)
    *G02F 1/1368*     (2006.01)
    *H01L 29/417*     (2006.01)
    *G02F 1/1345*     (2006.01)

(52) U.S. Cl.
    CPC .. *G02F 1/136209* (2013.01); *G02F 1/136227* (2013.01); *G02F 1/136286* (2013.01); *H01L 21/77* (2013.01); *H01L 27/12* (2013.01); *H01L 27/1262* (2013.01); *H01L 29/41733* (2013.01); *G02F 2001/13685* (2013.01)

(58) Field of Classification Search
    USPC ........... 257/59, 70, 75, E21.41; 438/48, 128, 438/149, 151
    See application file for complete search history.

(56) References Cited

U.S. PATENT DOCUMENTS

| | | | |
|---|---|---|---|
| 2013/0043480 A1* | 2/2013 | Adachi | G03B 27/00 257/71 |
| 2016/0064465 A1* | 3/2016 | Oh | H01L 27/3262 257/43 |
| 2016/0133473 A1* | 5/2016 | Wang | H01L 21/28114 257/72 |

FOREIGN PATENT DOCUMENTS

| | | |
|---|---|---|
| CN | 105097675 A | 11/2015 |
| KR | 1020150075512 A | 7/2015 |

* cited by examiner

ARRAY SUBSTRATE AND METHOD OF FORMING THE SAME

BACKGROUND OF THE INVENTION

1. Field of the Invention

The present invention relates to the field of liquid crystal display technology, and more particularly, to an array substrate and a method of forming the array substrate.

2. Description of the Prior Art

In the conventional technology, two methods of driving liquid crystal displays (LCDs) are passive driving and active driving. The passive driving is that the LCD panel is connected to an integrated circuit (IC). On other hand, the gate driver on array (GOA) technique is one kind of active driving. The GOA technique is that gate driver ICs are fabricated on an array substrate. The GOA technique can be replaced for a driver chip fabricated by external silicon chips. A GOA circuit is fabricated on the periphery of the panel directly, which helps to simplify the whole process, to reduce production costs, to enhance integrity of the LCD panel, and to make the LCD panel thinner.

The driving ability of a thin-film transistor (TFT) in the GOA circuit affects the charge efficiency of a pixel electrode capacitor ($C_{pixel}$) and the charge efficiency of a storage capacitor ($C_{st}$) to a great extent. The enhancement of the driving ability of the TFT improves the panel.

In the conventional technology, a gate electrode extends to the bottom of a source/drain electrode in the GOA bottom-gate structure to improve the driving ability of the TFT. Also, a channel is moved to the inside of a semiconductor layer from the touch surface of a gate oxide layer and a semiconductor layer for avoiding the influence of interface faults on transportation of a charge carrier. However, the gate electrode in the GOA bottom-gate structure and the semiconductor layer are not self-aligned, so an additional mask is necessary to form a light doping zone in the semiconductor layer. Besides, the deviation of the gate electrode and the semiconductor layer may cause overlapping of the gate electrode and the light doping zone, thereby affecting the electrical leakage of components and safety of components.

SUMMARY OF THE INVENTION

An object of the present invention is to propose an array substrate and a method of forming the array substrate for improving the ability of driving a TFT.

According to the present invention, an array substrate applied to a gate driver on array (GOA) circuit is provided. The array substrate comprises a substrate, a buffer layer, a first shielding pattern, a passivation layer, a first semiconductor pattern, a gate insulating layer, a first gate pattern, an interlayer insulating layer, and two first source/drain electrode patterns formed successively on the substrate.

A first through hole and a second through hole are arranged on the array substrate. One of the first source/drain electrode patterns is electrically connected to the first semiconductor pattern and the first shielding pattern through the first through hole.

The other one of the first source/drain electrode patterns is electrically connected to the first semiconductor pattern through the second through hole and is insulated from the first shielding pattern.

The width of the first shielding pattern is smaller than the distance of the first through hole and the second through hole so that a projection of the first shielding pattern on the substrate and a projection of the first through hole on the substrate overlap each other and that the projection of the first shielding pattern on the substrate and a projection of the second through hole are completely staggered.

The first semiconductor pattern comprising a first channel zone and two first heavy doping zones arranged at both sides of the first channel zone.

One of the first source/drain electrode patterns is electrically connected to one of the first heavy doping zones through the first through hole and the other of the first source/drain electrode patterns is electrically connected to the other one of the first heavy doping zones through the second through hole.

Furthermore, the first source/drain electrode patterns are connected to lateral sides of the first heavy doping zones through the first through hole and the second through hole, respectively, one of the first source/drain electrode patterns is connected to a ceiling of the first shielding pattern through the first through hole.

Furthermore, the array substrate further comprises a second shielding pattern, a second semiconductor pattern, a second gate pattern, and two second source/drain electrode patterns, the second shielding pattern is arranged between the buffer layer and the passivation layer, the second semiconductor pattern is arranged between the passivation layer and the gate insulating layer, the second gate pattern is arranged between the gate insulating layer and the interlayer insulating layer, The second source/drain electrode patterns are arranged on the interlayer insulating layer, the array substrate further comprises a third through hole and a fourth through hole, and the second source/drain electrode patterns are electrically connected to the second semiconductor pattern through the third through hole and the fourth through hole, respectively and are insulated from the second shielding pattern.

Furthermore, the second semiconductor pattern comprises a second channel zone and two second heavy doping zones arranged at both sides of the second channel zone. The second source/drain electrode patterns are connected to ceilings of the second heavy doping zones through the third through hole and the fourth through hole, respectively. A projection of the second shielding pattern on the substrate covers a projection of the second semiconductor pattern on the substrate.

According to the present invention, an array substrate comprises a substrate, a buffer layer, a first shielding pattern, a passivation layer, a first semiconductor pattern, a gate insulating layer, a first gate pattern, an interlayer insulating layer, and two first source/drain electrode patterns formed successively on the substrate.

A first through hole and a second through hole are arranged on the array substrate. One of the first source/drain electrode patterns is electrically connected to the first semiconductor pattern and the first shielding pattern through the first through hole.

The other one of the first source/drain electrode patterns is electrically connected to the first semiconductor pattern through the second through hole and is insulated from the first shielding pattern.

Furthermore, the width of the first shielding pattern is smaller than the distance of the first through hole and the second through hole so that a projection of the first shielding pattern on the substrate and a projection of the first through hole on the substrate overlap each other and that the projection of the first shielding pattern on the substrate and a projection of the second through hole are completely staggered.

Furthermore, the first semiconductor pattern comprises a first channel zone and two first heavy doping zones arranged at both sides of the first channel zone.

One of the first source/drain electrode patterns is electrically connected to one of the first heavy doping zones through the first through hole and the other of the first source/drain electrode patterns being electrically connected to the other one of the first heavy doping zones through the second through hole.

Furthermore, the first source/drain electrode patterns are connected to lateral sides of the first heavy doping zones through the first through hole and the second through hole, respectively, one of the first source/drain electrode patterns is connected to a ceiling of the first shielding pattern through the first through hole.

Furthermore, the array substrate further comprises a second shielding pattern, a second semiconductor pattern, a second gate pattern, and two second source/drain electrode patterns, the second shielding pattern is arranged between the buffer layer and the passivation layer, the second semiconductor pattern is arranged between the passivation layer and the gate insulating layer, the second gate pattern is arranged between the gate insulating layer and the interlayer insulating layer, The second source/drain electrode patterns are arranged on the interlayer insulating layer, the array substrate further comprises a third through hole and a fourth through hole, and the second source/drain electrode patterns are electrically connected to the second semiconductor pattern through the third through hole and the fourth through hole, respectively and are insulated from the second shielding pattern.

Furthermore, the second semiconductor pattern comprises a second channel zone and two second heavy doping zones arranged at both sides of the second channel zone.

The second source/drain electrode patterns are connected to ceilings of the second heavy doping zones through the third through hole and the fourth through hole, respectively.

A projection of the second shielding pattern on the substrate covers a projection of the second semiconductor pattern on the substrate.

According to the present invention, a method of forming an array substrate comprises steps of:

forming a buffer layer, a first shielding pattern, a passivation layer, a first semiconductor pattern, a gate insulating layer, a first gate pattern, and an interlayer insulating layer on a substrate;

forming a first through hole and a second through hole, an arrangement of the first through hole making the first semiconductor pattern and the first shielding pattern partially exposed, and an arrangement of the second through hole making the first semiconductor pattern partially exposed;

forming two first source/drain electrode patterns on the interlayer insulating layer, one of the first source/drain electrode patterns being electrically connected to the first semiconductor pattern and the first shielding pattern through the first through hole, and the other one of the first source/drain electrode patterns being electrically connected to the first semiconductor pattern through the second through hole and being electrically insulated from the first shielding pattern.

Furthermore, the width of the first shielding pattern is smaller than the distance of the first through hole and the second through hole so that a projection of the first shielding pattern on the substrate and a projection of the first through hole on the substrate overlap each other and that the projection of the first shielding pattern on the substrate and a projection of the second through hole are completely staggered.

Furthermore, the first source/drain electrode patterns are connected to lateral sides of the first heavy doping zones through the first through hole and the second through hole, respectively, one of the first source/drain electrode patterns is connected to a ceiling of the first shielding pattern through the first through hole.

Furthermore, the step of forming the buffer layer, the first shielding pattern, the passivation layer, the first semiconductor pattern, the gate insulating layer, the first gate pattern, and the interlayer insulating layer on the substrate further comprises a step of;

forming a second shielding pattern between the buffer layer and the passivation layer, forming a second semiconductor pattern between the passivation layer and the gate insulating layer, and forming a second gate pattern between the gate insulating layer and the interlayer insulating layer;

the step of forming the first through hole and the second through hole further comprises a step of;

forming a third through hole and a fourth through hole, and an arrangement of the third through hole and an arrangement of the fourth through hole making the second semiconductor pattern partially exposed;

the step of forming the first source/drain electrode patterns further comprises a step of;

forming two second source/drain electrode patterns on the interlayer insulating layer so that the second source/drain electrode patterns are electrically connected to the second semiconductor pattern through the third through hole and the fourth through hole, respectively and are electrically insulated from the second shielding pattern.

The present invention provides beneficial effects as follows: The present invention where the array substrate and the method of forming the array substrate are proposed is related to a top-gate design. A light shielding layer is arranged on a buffer layer and connected to a source/drain electrode so that a mask of the light shading layer is multiplexed. The driving ability of the TFT driving circuit still improves without increasing the original processes and production costs.

DETAILED DESCRIPTION OF THE PREFERRED EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 1:
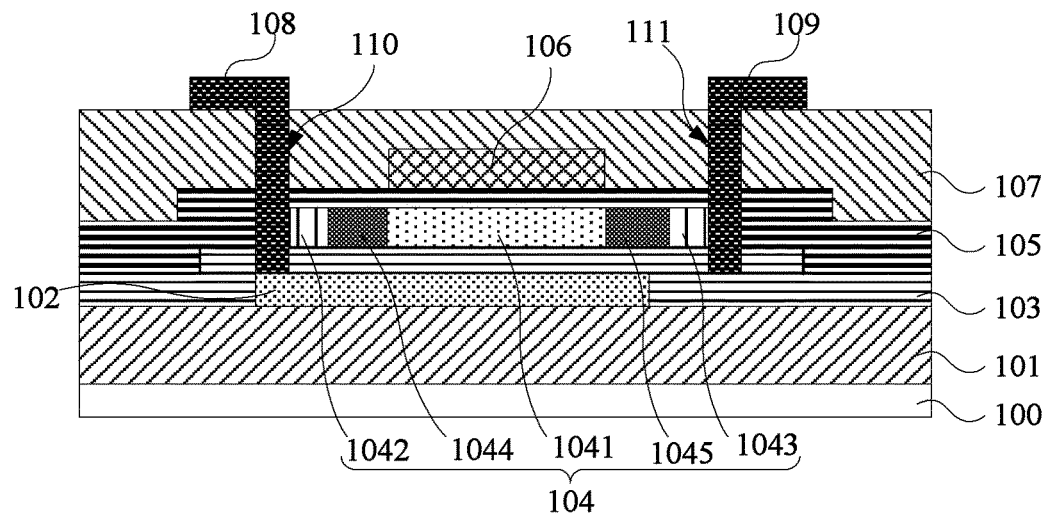
FIG. 1 is a schematic diagram of an array substrate according to a first preferred embodiment of the present invention.

Please refer to FIG. 1. FIG. 1 is a schematic diagram of an array substrate according to a first preferred embodiment of the present invention. The array substrate comprises a buffer layer 101, a first shielding pattern 102, a passivation layer 103, a first semiconductor pattern 104, a gate insulating layer 105, a first gate pattern 106, an interlayer insulating layer 107, and two first source/drain electrode patterns 108 and 109 formed successively on a substrate 100.

A first through hole 110 and a second through hole 111 are arranged on the array substrate. One 108 of the first source/drain electrode patterns 108 and 109 is electrically connected to the first semiconductor pattern 104 and the first shielding pattern 102 through the first through hole 110. The other one 109 of the first source/drain electrode patterns 108 and 109 is electrically connected to the first semiconductor pattern 104 through the second through hole 111. The electrode pattern 109 and the first shielding pattern 102 are electrically insulated from each other.

The substrate 100 is a glass substrate or a plastic substrate. But, the substrate 100 can be fabricated from other transparent material.

Both of the first shielding pattern 102 and the first gate pattern 106 are fabricated from metal such as molybdenum (Mo), titanium (Ti), copper (Cu), rubidium (Rb), or an alloy of the metals.

The width of the first shielding pattern 102 is smaller than the distance between the first through hole 110 and the second through hole 111. Therefore, the projection of the first shielding pattern 102 on the substrate 100 and the projection of the first through hole 110 on the substrate 100 overlap each other while the projection of the first shielding pattern 102 on the substrate 100 and the projection of the second through hole 111 are completely staggered.

The first semiconductor pattern 104 comprises a first channel zone 1041 and two first heavy doping zones 1042 and 1043 arranged at both sides of the first channel zone 1041. The first source/drain electrode pattern 108 is electrically connected to the first heavy doping zone 1042 through the first through hole 110. The first source/drain electrode pattern 109 is electrically connected to the first heavy doping zone 1043 through the second through hole 111.

The first source/drain electrode patterns 108 and 109 are connected to a lateral side of the first heavy doping zone 1042 and a lateral side of the first heavy doping zone 1043 through the first through hole 110 and the second through hole 111, respectively. One of the first source/drain electrode patterns 108 and 109 is connected to the ceiling of the first shielding pattern 102 through the first through hole 110.

The first semiconductor pattern 104 further comprises two first light doping zones 1044 and 1045. The first light doping zone 1044 is arranged between the first channel zone 1041 and the first heavy doping zone 1042. Also, the first light doping zone 1044 is adjacent to the first channel zone 1041 and the first heavy doping zone 1042 in position. The first light doping zone 1045 is arranged between the first channel zone 1041 and the first heavy doping zone 1043. Also, the first light doping zone 1045 is adjacent to the first channel zone 1041 and the first heavy doping zone 1043 in position. The first light doping zones 1044 and 1045 are formed with the process of channel light doping based on the template of the first gate pattern 106 after the first gate pattern 106 is formed.

The first source/drain electrode pattern 108 is connected to a lateral side of the first heavy doping zone 1042 through the first through hole 110, and the first source/drain electrode pattern 109 is connected to a lateral side of the first heavy doping zone 1043 through the second through hole 111 for forming transportation passages of a charge carrier. When the electrical circuit conducts, the density of the charge carrier increases. The turn-on current increases as well. The voltage imposed on the first shielding pattern 102 attracts the charge carrier. Subsequently, the channel is moved to the inside of the first semiconductor pattern 104 from the connection zone with the gate insulating layer 105 and the first semiconductor pattern 104. In this way, the transportation of the charge carrier is not affected by interface faults. Also, the loss of the charge carrier decreases in transportation, and the driving ability of the TFT improves.

Figure 2:
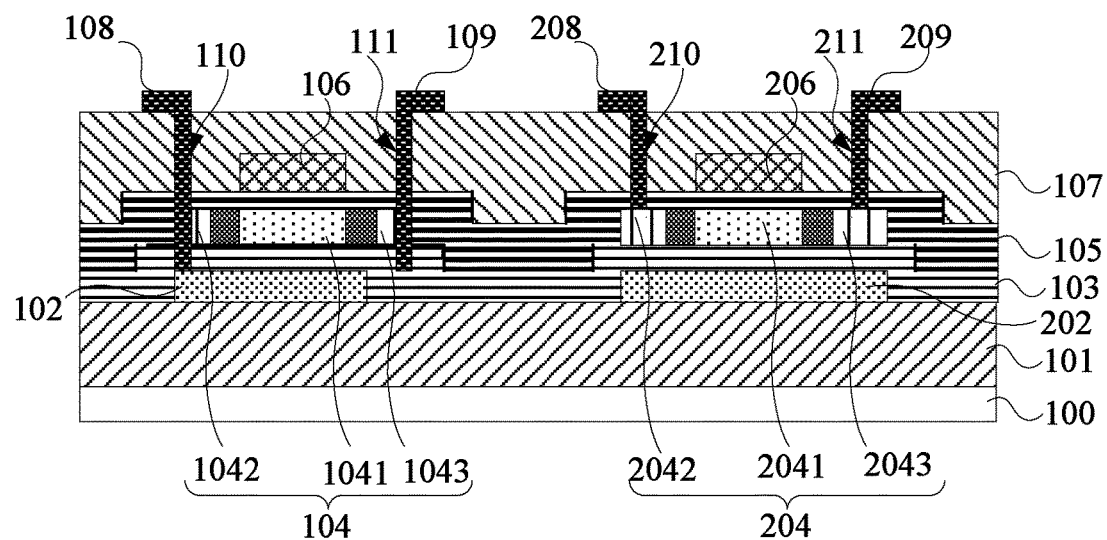
FIG. 2 is a schematic diagram of an array substrate according to a second preferred embodiment of the present invention.

Please refer to FIG. 2. FIG. 2 is a schematic diagram of an array substrate according to a second preferred embodiment of the present invention.

The array substrate comprises a top gate in the gate-terminal zone and the top gate in the active display zone on the substrate 100 as showing in FIG. 1 in this embodiment. The top gate in the gate-terminal zone can be used as a switch component of the GOA, and the top gate in the active display zone can be used as a switch component of the display pixel.

The array substrate further comprises a second shielding pattern 202, a second semiconductor pattern 204, a second gate pattern 206, and two second source/drain electrode patterns 208 and 209 as shown in FIG. 2. The second shielding pattern 202 is arranged between the buffer layer 101 and the passivation layer 103. The second semiconductor pattern 204 is arranged between the passivation layer 103 and the gate insulating layer 105. The second gate pattern 206 is arranged between the gate insulating layer 105 and the interlayer insulating layer 107. The second source/drain electrode patterns 208 and 209 are arranged on the interlayer insulating layer 107. The array substrate further comprises a third through hole 210 and a fourth through hole 211. The second source/drain electrode patterns 208 and 209 are electrically connected to the second semiconductor pattern 204 through the third through hole 210 and the fourth through hole 211, respectively. Also, the second source/drain electrode patterns 208 and 209 are insulated from the second shielding pattern 202.

The second semiconductor pattern 204 comprises a second channel zone 2041 and two second heavy doping zones 2042 and 2043 arranged at both sides of the second channel zone 2041. The second source/drain electrode patterns 208 and 209 are connected to the ceiling of the second heavy doping zone 2044 and the ceiling of the second heavy doping zone 2045 through the third through hole 210 and the fourth through hole 211, respectively. The projection of the second shielding pattern 202 on the substrate 100 covers the projection of the second semiconductor pattern 204 on the substrate 100.

The second semiconductor pattern 204 further comprises two second light doping zones 2044 and 2045. The second light doping zone 2044 and the second channel zone 2041 are arranged adjacently. The light doping zone 2044 and the second heavy doping zone 2042 are arranged adjacently. The second light doping zone 2045 and the second channel zone 2041 are arranged adjacently. The light doping zone 2045 and the second heavy doping zone 2043 are arranged adjacently. The second light doping zones 2044 and 2045 are formed with the process of channel light doping based on the template of the second gate pattern 206 after the second gate pattern 206 is formed.

The etching depth of the third through hole 210 and the fourth through hole 211 is decided by the etching choice ratio and the gradient etching method. The third through hole 210 and the fourth through hole 211 are not connected to the second shielding pattern 202. The first shielding pattern 102 and the second shielding pattern 202 are fabricated by metal or an alloy while the width of the first shielding pattern 102 and the width of the second shielding pattern 202 are different, and the first shielding pattern 102 and the second shielding pattern 202 have totally different functions in this embodiment. The second shielding pattern 202 needs to be wide enough to keep out the second channel zone 2041 and the second heavy doping zones 2042 and 2043. The first shielding pattern 102 on which the voltage imposed attracts the charge carrier, thereby moving the channel to the inside of the first semiconductor pattern 104 from the connection zone with the gate insulating layer 105 and the first semiconductor pattern 104. In this way, the transportation of the charge carrier is not affected by interface faults. Also, the loss of the charge carrier decreases in transportation, and the driving ability of the TFT improves.

Figure 3:
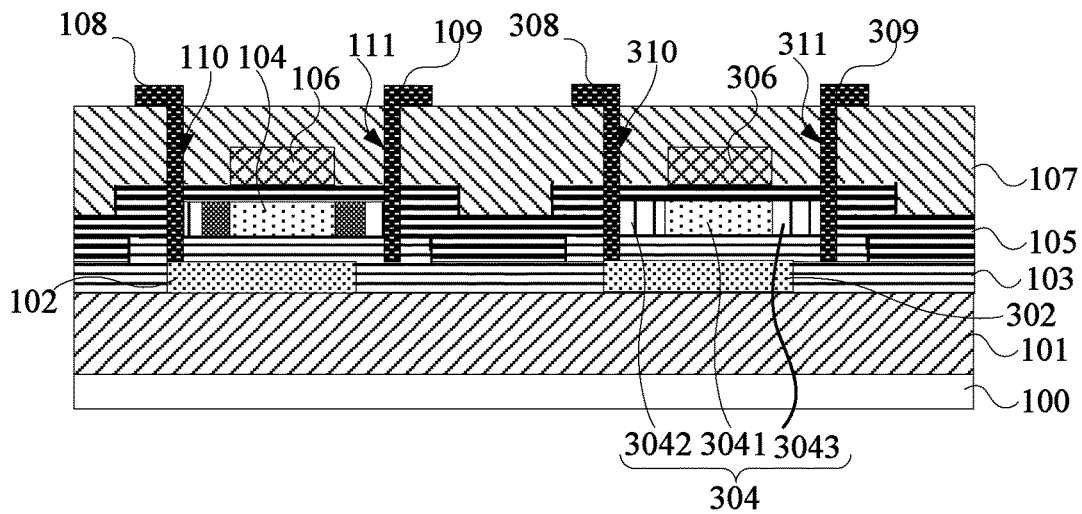
FIG. 3 is a schematic diagram of an array substrate according to a third preferred embodiment of the present invention.

Please refer to FIG. 3. FIG. 3 is a schematic diagram of an array substrate according to a third preferred embodiment of the present invention.

The array substrate comprises an N-type TFT (NTFT) top gate and a P-type (PTFT) top gate on the substrate 100 as showing in FIG. 1 in this embodiment. Both of the NTFT top gate and the PTFT top gate can be used as a switch component of the GOA.

As shown in FIG. 3, the array substrate further comprises a third shielding pattern 302, a third semiconductor pattern 304, a third gate pattern 306, and two third source/drain electrode patterns 308 and 309. The third shielding pattern 302 is arranged between the buffer layer 101 and the passivation layer 103. The third semiconductor pattern 304 is arranged between the passivation layer 103 and the gate insulating layer 105. The third gate pattern 306 is arranged between the gate insulating layer 105 and the interlayer insulating layer 107. The third source/drain electrode patterns 308 and 309 are arranged on the interlayer insulating layer 107. The array substrate further comprises a fifth through hole 310 and a sixth through hole 311. The third source/drain electrode pattern 308 is electrically connected to the third semiconductor pattern 304 and the third shielding pattern 302 through the fifth through hole 310. The third source/drain electrode pattern 309 is electrically connected to the third semiconductor pattern 304 through the sixth through hole 311. Also, the third source/drain electrode pattern 309 is insulated from the third shielding pattern 302.

The third semiconductor pattern 304 comprises a third channel zone 3041 and two third heavy doping zones 3042 and 3043 arranged at both sides of the third channel zone 3041. The source/drain electrode pattern 308 is electrically connected to the third heavy doping zone 3042 through the fifth through hole 310. The third source/drain electrode pattern 309 is electrically connected to the third heavy doping zone 3043 through the sixth through hole 311.

The third source/drain electrode patterns 308 and 309 are connected to a lateral side of the third heavy doping zone 3042 and a lateral side of the third heavy doping zone 3043 through the fifth through hole 310 and the sixth through hole 311, respectively. One of the third source/drain electrode patterns 308 and 309 is connected to the ceiling of the third shielding pattern 302 through the fifth through hole 310.

The array substrate proposed by this embodiment is primarily used in metal oxide semiconductor (MOS) components. A light shielding layer is arranged on the buffer layer and connected to the source/drain electrodes so the mask of the light shading layer is multiplexed. The driving ability of the TFT still improves without increasing the original processes and production costs.

Figure 4:
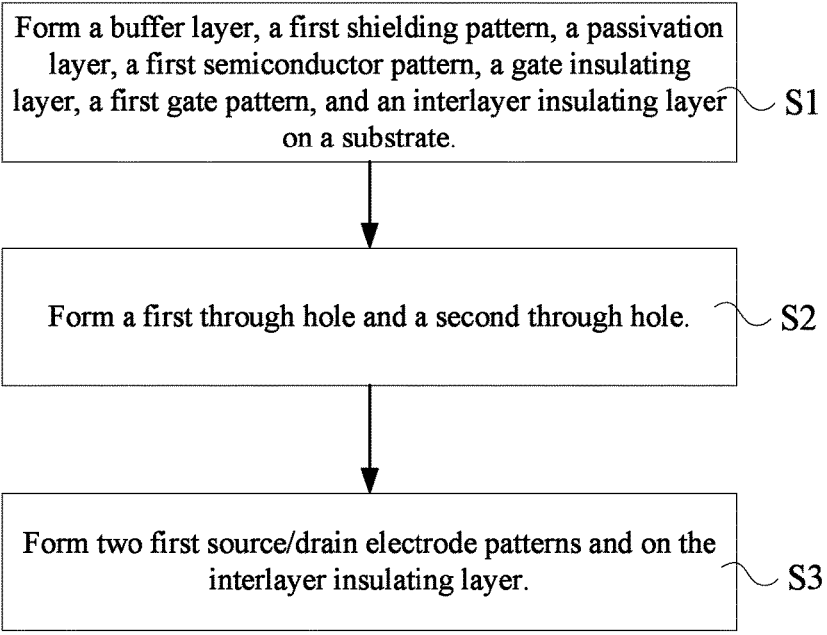
FIG. 4 is a flowchart of a method of forming the array substrate.

The present invention further proposes a method of forming an array substrate. FIG. 4 is a flowchart of a method of forming the array substrate. FIG. 5a through FIG. 5g are cross-sectional views of the array substrate in each step in the present invention. The method of forming the array substrate comprises some concrete steps as follows:

Step S1: Form a buffer layer 401, a first shielding pattern 402, a passivation layer 403, a first semiconductor pattern 404, a gate insulating layer 405, a first gate pattern 406, and an interlayer insulating layer 407 on a substrate 400.

The first semiconductor pattern 404 comprises a first channel zone 4041 and two first heavy doping zones 4042 and 4043. The first heavy doping zones 4042 and 4043 are arranged at both sides of the first channel zone 4041. The first semiconductor pattern 404 further comprises two first light doping zones 4044 and 4045. The first light doping zone 4044 and the first channel zone 4041 are arranged adjacently. The first light doping zone 4044 and the heavy doping zone 4042 are arranged adjacently. The first light doping zone 4045 and the first channel zone 4041 are arranged adjacently. The first light doping zone 4045 and the heavy doping zone 4043 are arranged adjacently.

The step comprises steps of depositing the buffer layer 401 and the first shielding pattern 402 successively on the substrate 400 with the method of chemical vapor deposition (CVD). The buffer layer 401 is basically a SiOx layer or a SiNx layer. The first shielding pattern 402 is patterned with the method of mask photolithography for forming a predetermined pattern.

Figure 5A:
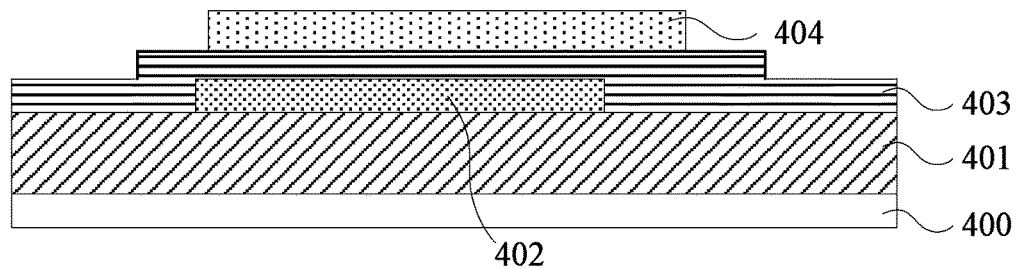
FIG. 5a through FIG. 5g are cross-sectional views of the array substrate in each step in the present invention.
Figure 5B:
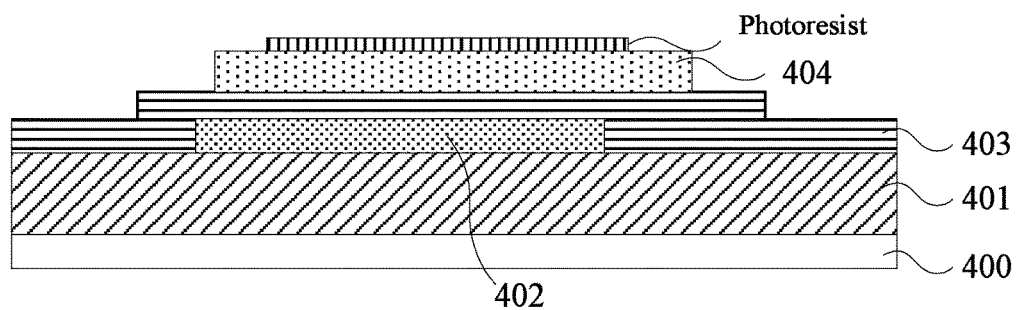
Figure 5C:
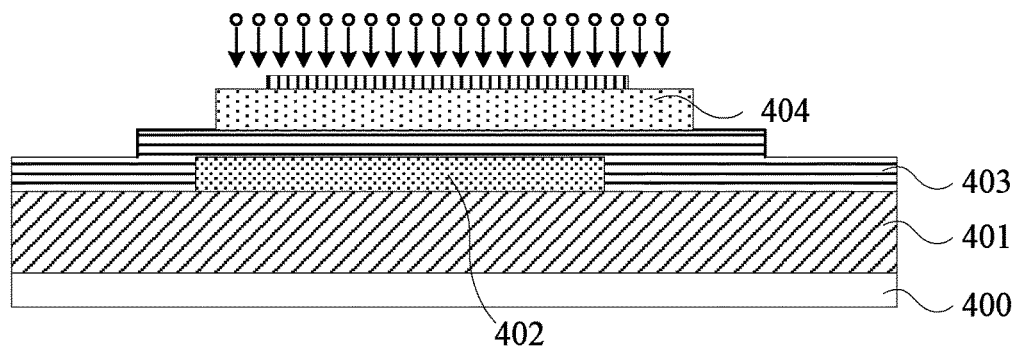
Figure 5D:
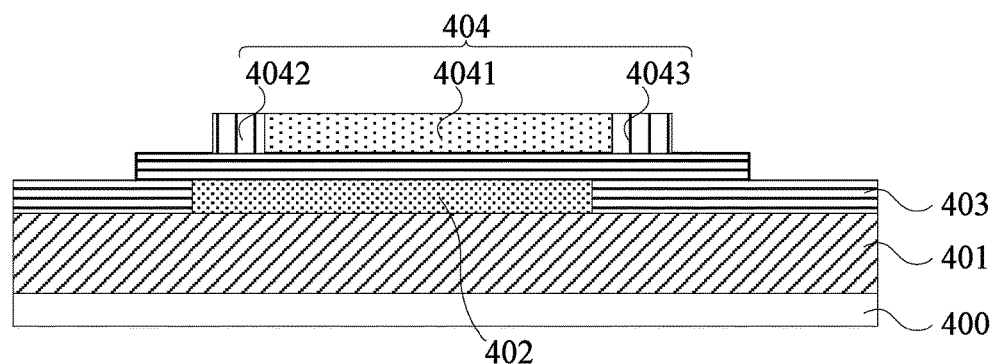

An amorphous silicon (a-Si) layer is formed on the buffer layer 401 with the method of CVD, the a-Si layer is transformed into a poly-silicon layer using the annealing technique, and a predetermined pattern is formed on the poly-silicon layer with the mask process for further forming the first semiconductor pattern 404, as FIG. 5a shows.

Two first heavy doping zones 4042 and 4043 are formed after the formed first semiconductor pattern 404 undergoes the composition process. The composition process comprises steps of coating a photoresist on the first semiconductor pattern 404, forming a photoresist all preserve zone and a photoresist non-preserve zone using the mask technique, removing the photoresist of the photoresist non-preserve zone, doping the exposed terminals of the first semiconductor pattern 404, forming the first heavy doping zones 4042 and 4043, and removing the photoresist.

The gate insulating layer 405 is deposited on the upper surface of the first semiconductor pattern 404. The first gate pattern 406 is deposited and patterned with the method of mask photolithography. The first gate pattern 406 and the first channel zone 4041 are self-aligned.

Figure 5E:
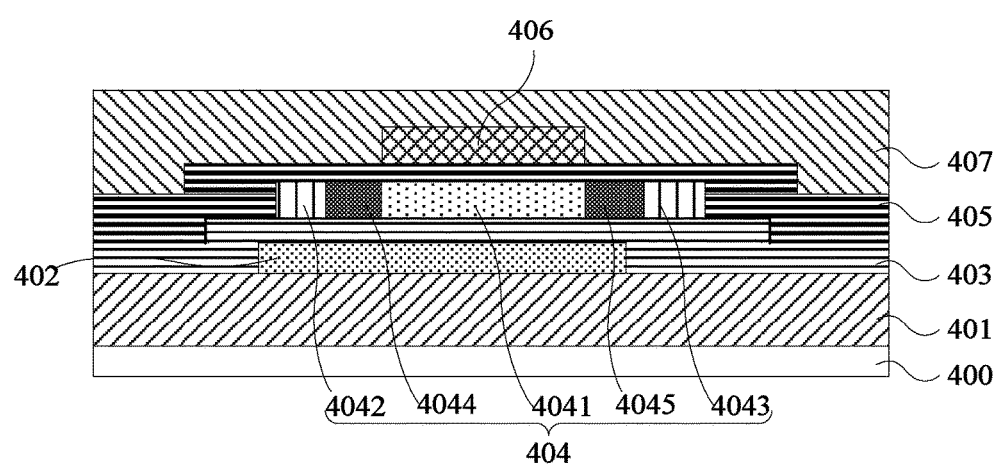

Two first light doping zones 4044 and 4045 are formed at both sides of the first channel zone 4041 using the doping technique based on the template of the first gate pattern 406, the first gate pattern 406 and the first channel zone 4041 are self-aligned for forming two first light doping zones 4044 and 4045 in the process of doping while preventing doping ions from entering the first channel zone 4041, and the interlayer insulating layer 407 is formed on the upper surface of the first gate pattern 406, as FIG. 5e shows.

Figure 5F:
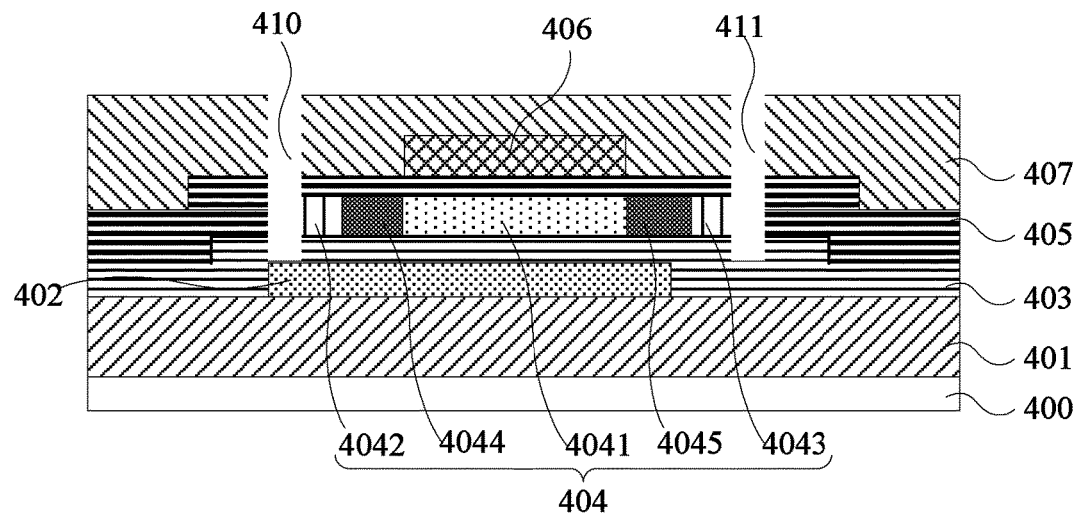

Step S2: Form the first through hole 410 and the second through hole 411 where the arrangement of the first through hole 410 makes the first semiconductor pattern 404 and the first shielding pattern 402 partially exposed, and the arrangement of the second through hole 411 makes the first semiconductor pattern 404 partially exposed, as FIG. 5f shows.

Figure 5G:
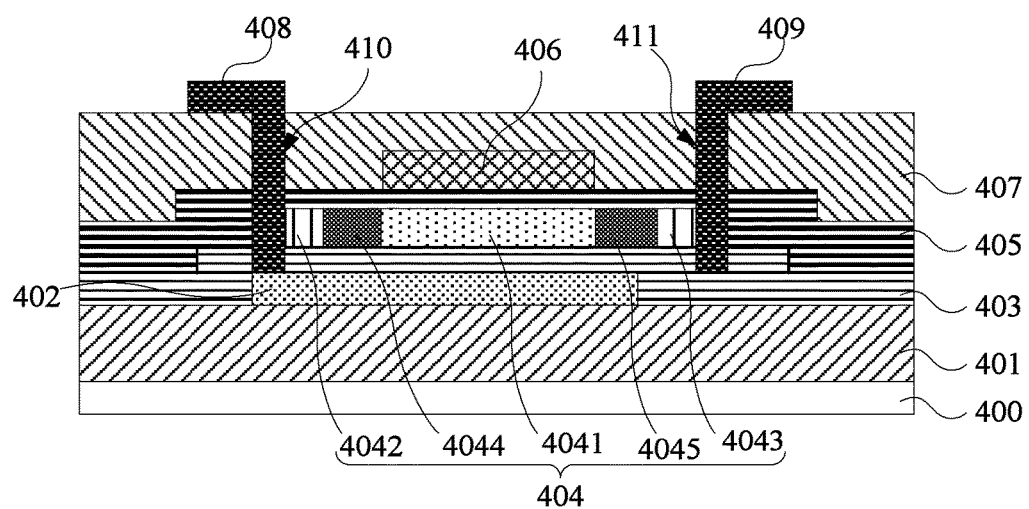

Step S3: Form two first source/drain electrode patterns 408 and 409 on the interlayer insulating layer 407, one of the first source/drain electrode patterns 408 and 409 being electrically connected to the first semiconductor pattern 404 and the first shielding pattern 402 through the first through hole 410, and the other one of the first source/drain electrode patterns 408 and 409 being electrically connected to the first semiconductor pattern 404 through the second through hole 411 and being electrically insulated from the first shielding pattern 402, as FIG. 5g shows.

The source/drain electrode patterns 408 and 409 can be formed with methods, such as sputtering and CVD, and patterned with the method of mask photolithography.

The width of the first shielding pattern 402 is smaller than the distance of the first through hole 410 and the second through hole 411. Therefore, the projection of the first shielding pattern 402 on the substrate 400 and the projection of the first through hole 410 on the substrate 400 overlaps each other while the projection of the first shielding pattern 402 on the substrate 100 and the projection of the second through hole 411 are completely staggered.

The first source/drain electrode patterns 408 and 409 are connected to a lateral side of the first heavy doping zone 4042 and a lateral side of the first heavy doping zone 4043 through the first through hole 410 and the second through hole 411, respectively. The first source/drain electrode pattern 408 is connected to the ceiling of the first shielding pattern 402 through the first through hole 410.

Figure 6:
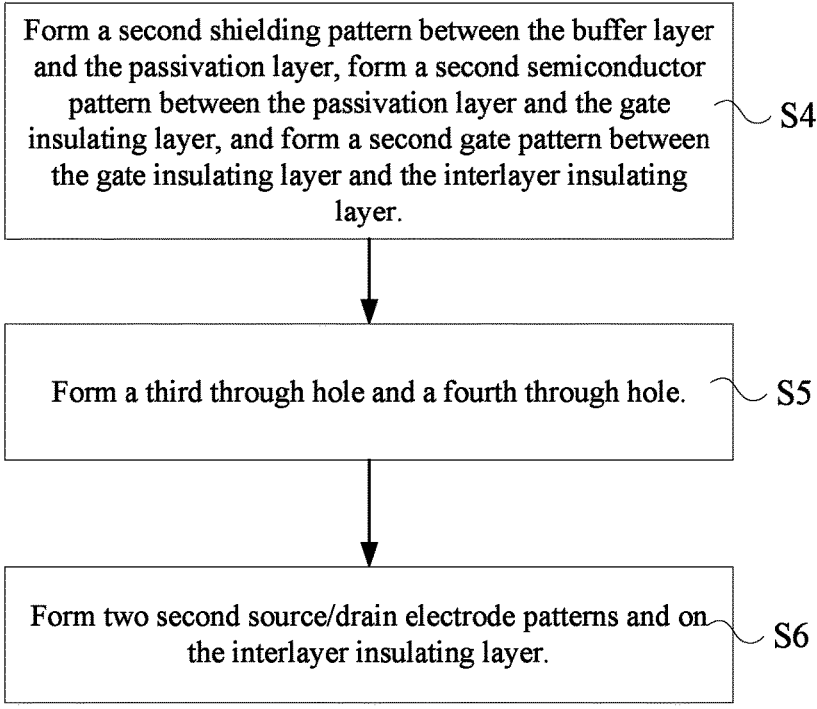
FIG. 6 is a flowchart of a method of forming an array substrate according to another embodiment of the present invention.
Figure 7A:
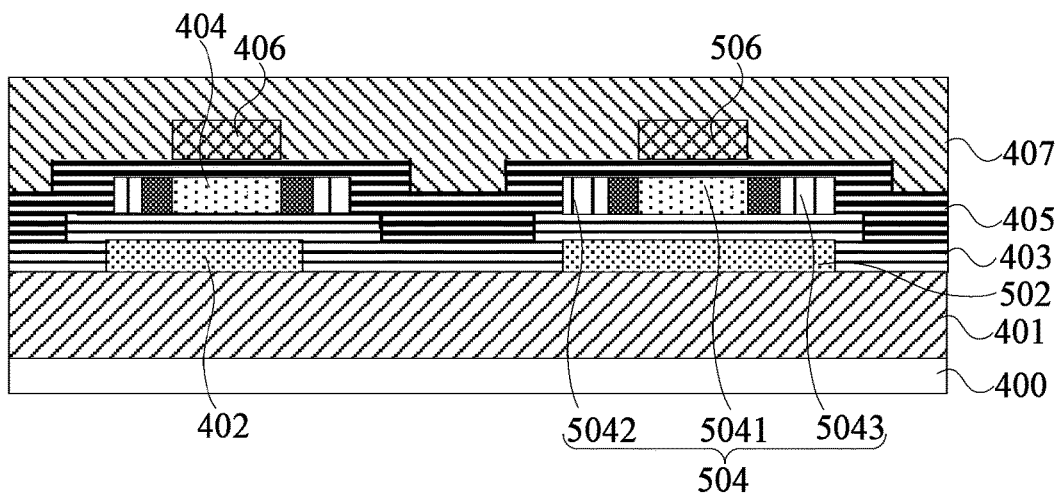
FIG. 7a through FIG. 7c are cross-sectional views of the array substrate in each step according to this embodiment of the present invention.
Figure 7B:
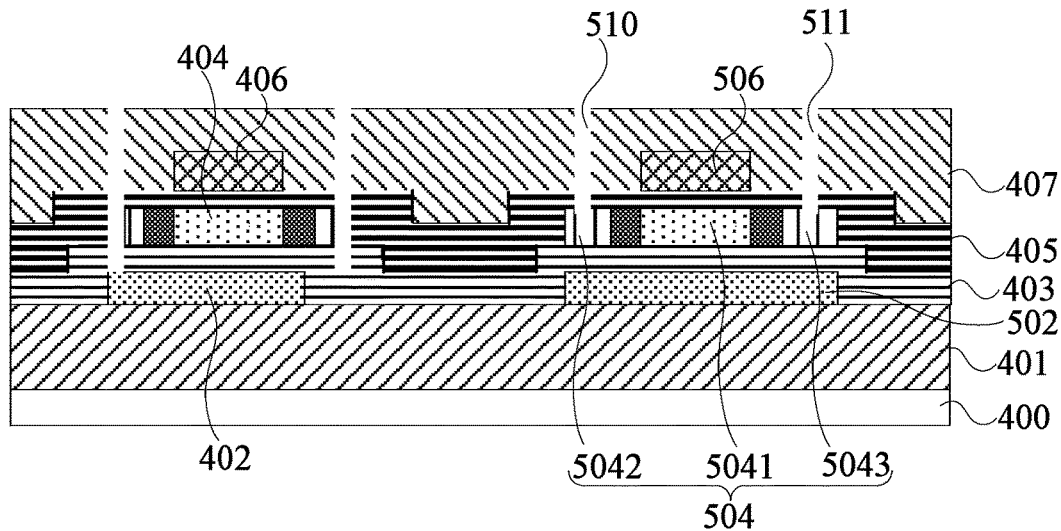
Figure 7C:
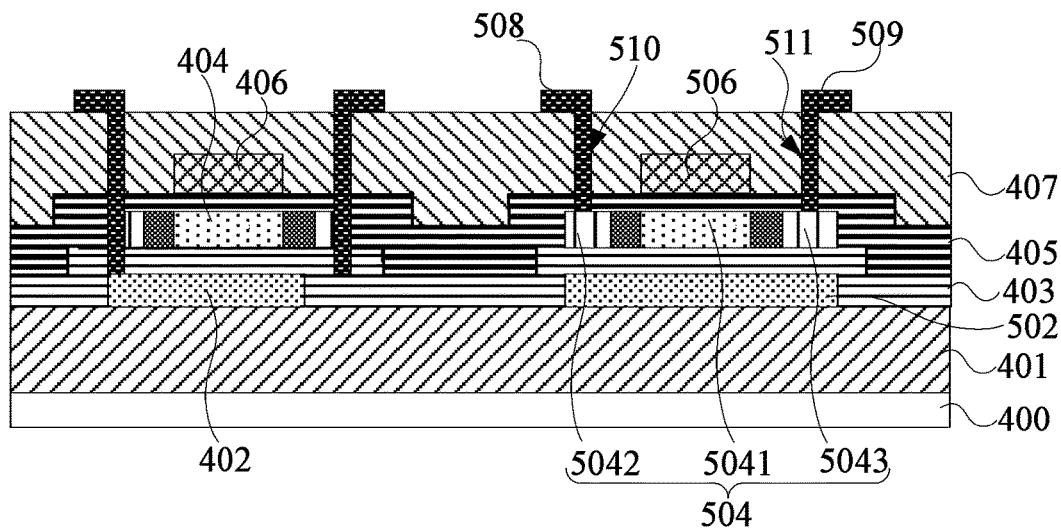

FIG. 6 is a flowchart of a method of forming an array substrate according to another embodiment of the present invention. FIG. 7a through FIG. 7c are cross-sectional views of the array substrate in each step according to this embodiment of the present invention. The method of forming the array substrate proposed by this embodiment is based on the steps described in the previous embodiment, so this embodiment is also based on the previous embodiment.

The step of forming the buffer layer 401, the first shielding pattern 402, the passivation layer 403, the first semiconductor pattern 404, the gate insulating layer 405, the first gate pattern 406, and the interlayer insulating layer 407 on a substrate 400 further comprises a step of:

Step S4: Form a second shielding pattern 502 between the buffer layer 401 and the passivation layer 403, form a second semiconductor pattern 504 between the passivation layer 403 and the gate insulating layer 405, and form a second gate pattern 506 between the gate insulating layer 405 and the interlayer insulating layer 407, as FIG. 7a shows.

The second semiconductor pattern 504 further comprises two second light doping zones 5044 and 5045. The second light doping zone 5044 and a second channel zone 5041 are arranged adjacently. The light doping zone 5044 and a second heavy doping zone 5042 are arranged adjacently. The second light doping zone 5045 and the second channel zone 5041 are arranged adjacently. The light doping zone 5045 and a second heavy doping zone 2043 are arranged adjacently. The second light doping zones 5044 and 5045 are formed with the process of channel light doping based on the template of the second gate pattern 506 after the second gate pattern 506 is formed.

Steps of forming the second heavy doping zones and the second light doping zones are suggested to refer to the previous embodiment, and the steps are not going to be detailed here.

The step of forming the first through hole 410 and the second through hole 411 further comprises a step of:

Step S5: Form a third through hole 510 and a fourth through hole 511 where the arrangement of the third through hole 510 and the fourth through hole 511 makes the second semiconductor pattern 504 partially exposed, as FIG. 7b shows.

The step of forming the first source/drain electrode patterns 408 and 409 on the interlayer insulating layer 407 further comprises a step of:

Step S6: Form two second source/drain electrode patterns 508 and 509 on the interlayer insulating layer 407. The second source/drain electrode patterns 508 and 509 are electrically connected to the second semiconductor pattern 504 through the third through hole 510 and the fourth through hole 511, respectively, and are electrically insulated from the second shielding pattern 502, as FIG. 7c shows.

Figure 8:
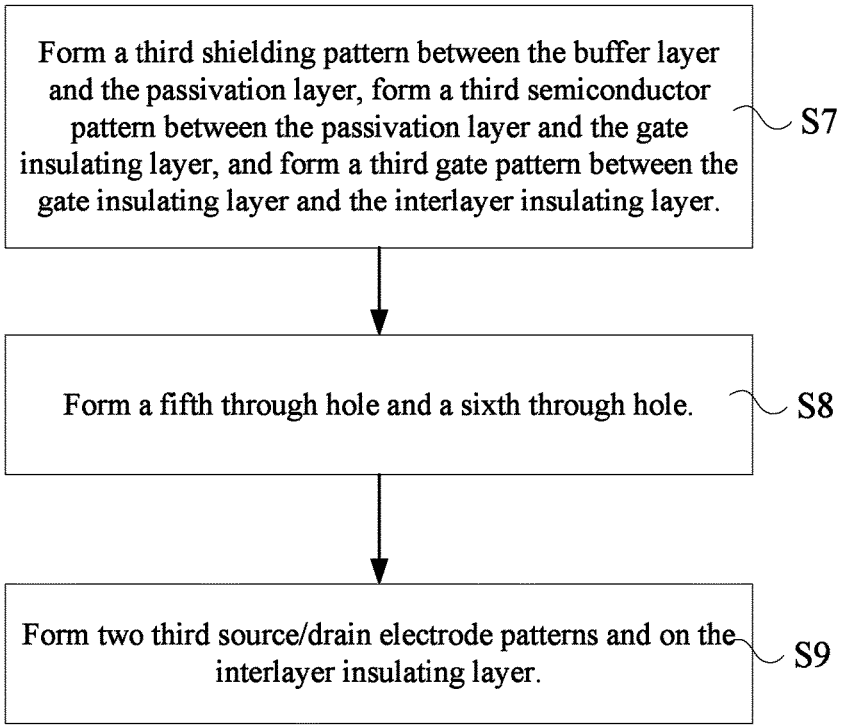
FIG. 8 is a flowchart of a method of forming the array substrate according to another embodiment of the present invention.
Figure 9A:
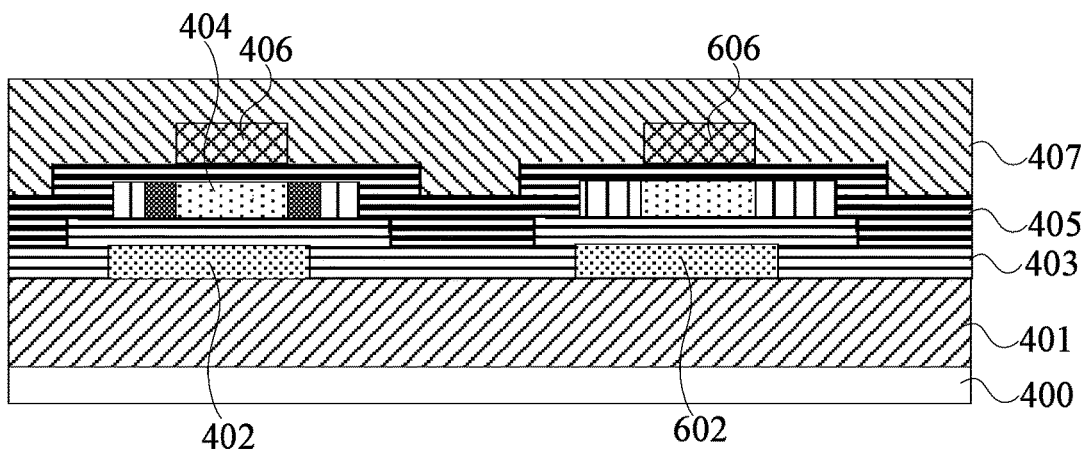
FIG. 9a through FIG. 9c are cross-sectional views of the array substrate in each step according to this embodiment of the present invention.
Figure 9B:
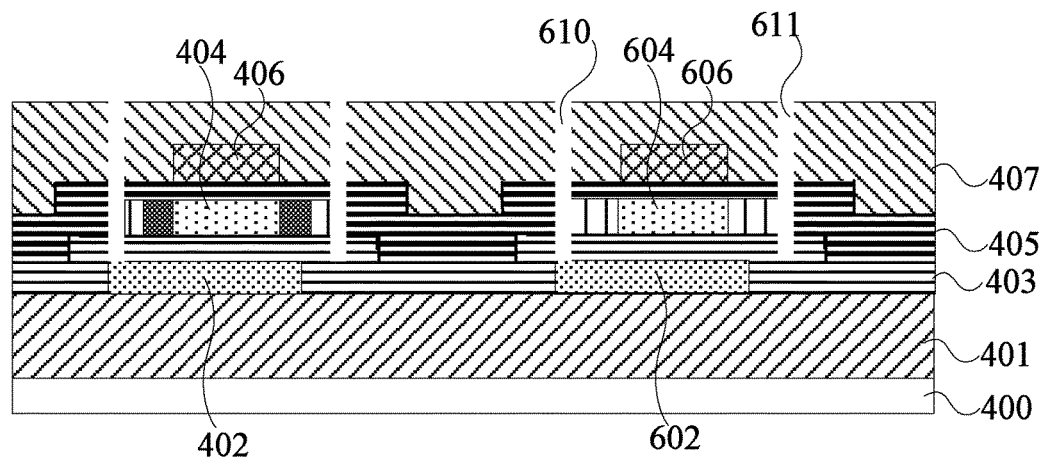
Figure 9C:
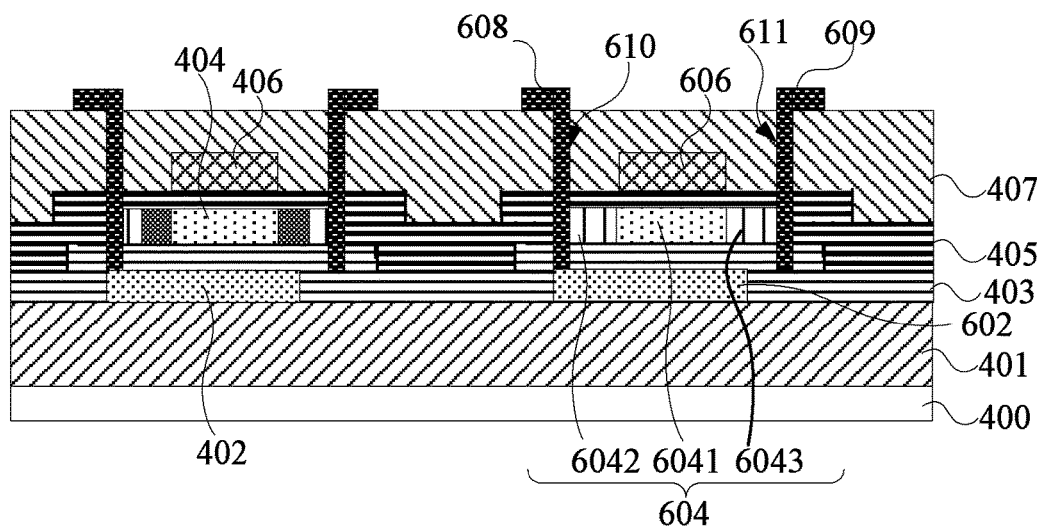

FIG. 8 is a flowchart of a method of forming the array substrate according to another embodiment of the present invention. FIG. 9a through FIG. 9c are cross-sectional views of the array substrate in each step according to this embodiment of the present invention. The method of forming the array substrate proposed by this embodiment is based on the steps described in the first embodiment, so this embodiment is also based on the first embodiment.

In this embodiment, the array substrate used in the present invention is applied to the PTFT, and the method of applying the array substrate to the PTFT is described.

The step of forming the buffer layer 401, the first shielding pattern 402, the passivation layer 403, the first semiconductor pattern 404, the gate insulating layer 405, the first gate pattern 406, and the interlayer insulating layer 407 on a substrate 400 further comprises a step of:

Step S7: Form a third shielding pattern 602 between the buffer layer 401 and the passivation layer 403, form a third semiconductor pattern 604 between the passivation layer 403 and the gate insulating layer 405, and form a third gate pattern 606 between the gate insulating layer 405 and the interlayer insulating layer 407, as FIG. 9a shows.

It is notified that the present embodiment adopts the method of forming the PTFT. It is unnecessary to adopt the step of light doping in the first embodiment in the PTFT preparation process. It is simply heavy doping for the PTFT. Therefore, the third semiconductor pattern 604 comprises a third channel zone 6041 and two heavy doping zones 6042 and 6043 arranged at both sides of the third channel zone 6041.

The Step of forming the first through hole 410 and the second through hole 411 further comprises a step of:

Step S8: Form a fifth through hole 610 and a sixth through hole 611 where the arrangement of the fifth through hole 610 makes the third semiconductor pattern 604 and the third shielding pattern 602 partially exposed, and the arrangement of the sixth through hole 611 makes the third semiconductor pattern 604 partially exposed, as FIG. 9b shows.

The Step of forming the first source/drain electrode patterns 408 and 409 on the interlayer insulating layer 407 further comprises a step of:

Step S9: Form two third source/drain electrode patterns 608 and 609 on the interlayer insulating layer 407. The third source/drain electrode pattern 608 is electrically connected to the third semiconductor pattern 604 and the third shielding pattern 602 through the fifth through hole 510. The third source/drain electrode pattern 609 is electrically connected to the third semiconductor pattern 604 through the sixth through hole 611 and electrically insulated from the third shielding pattern 602, as FIG. 9c shows.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. An array substrate, applied to a gate driver on array (GOA) circuit, the array substrate comprising a substrate, a buffer layer, a first shielding pattern, a passivation layer, a first semiconductor pattern, a gate insulating layer, a first gate pattern, an interlayer insulating layer, and two first source/drain electrode patterns formed successively on the substrate;
   a first through hole and a second through hole being arranged on the array substrate, one of the first source/drain electrode patterns being electrically connected to the first semiconductor pattern and the first shielding pattern through the first through hole;
   the other one of the first source/drain electrode patterns being electrically connected to the first semiconductor pattern through the second through hole and being insulated from the first shielding pattern;
   the width of the first shielding pattern being smaller than the distance of the first through hole and the second through hole so that a projection of the first shielding pattern on the substrate and a projection of the first through hole on the substrate overlap each other and that the projection of the first shielding pattern on the substrate and a projection of the second through hole are completely staggered;
   the first semiconductor pattern comprising a first channel zone and two first heavy doping zones arranged at both sides of the first channel zone;
   one of the first source/drain electrode patterns being electrically connected to one of the first heavy doping zones through the first through hole and the other of the first source/drain electrode patterns being electrically connected to the other one of the first heavy doping zones through the second through hole
      wherein the first source/drain electrode patterns are connected to lateral sides of the first heavy doping zones through the first through hole and the second through hole, respectively, one of the first source/drain electrode patterns is connected to a ceiling of the first shielding pattern through the first through hole.

2. The array substrate of claim 1, wherein the array substrate further comprises a second shielding pattern, a second semiconductor pattern, a second gate pattern, and two second source/drain electrode patterns, the second shielding pattern is arranged between the buffer layer and the passivation layer, the second semiconductor pattern is arranged between the passivation layer and the gate insulating layer, the second gate pattern is arranged between the gate insulating layer and the interlayer insulating layer, The second source/drain electrode patterns are arranged on the interlayer insulating layer, the array substrate further comprises a third through hole and a fourth through hole, and the second source/drain electrode patterns are electrically connected to the second semiconductor pattern through the third through hole and the fourth through hole, respectively and are insulated from the second shielding pattern.

3. The array substrate of claim 1, wherein the second semiconductor pattern comprises a second channel zone and two second heavy doping zones arranged at both sides of the second channel zone;
   the second source/drain electrode patterns are connected to ceilings of the second heavy doping zones through the third through hole and the fourth through hole, respectively;
   a projection of the second shielding pattern on the substrate covers a projection of the second semiconductor pattern on the substrate.

4. An array substrate comprising a substrate, a buffer layer, a first shielding pattern, a passivation layer, a first semiconductor pattern, a gate insulating layer, a first gate pattern, an interlayer insulating layer, and two first source/drain electrode patterns formed successively on the substrate;
   a first through hole and a second through hole being arranged on the array substrate, one of the first source/drain electrode patterns being electrically connected to the first semiconductor pattern and the first shielding pattern through the first through hole;
   the other one of the first source/drain electrode patterns being electrically connected to the first semiconductor pattern through the second through hole and being insulated from the first shielding pattern
      wherein the first semiconductor pattern comprises a first channel zone and two first heavy doping zones arranged at both sides of the first channel zone;
   one of the first source/drain electrode patterns is electrically connected to one of the first heavy doping zones through the first through hole and the other of the first source/drain electrode patterns is electrically connected to the other one of the first heavy doping zones through the second through hole
      wherein the first source/drain electrode patterns are connected to lateral sides of the first heavy doping zones through the first through hole and the second through hole, respectively, one of the first source/drain electrode patterns is connected to a ceiling of the first shielding pattern through the first through hole.

5. The array substrate of claim 4, wherein the width of the first shielding pattern is smaller than the distance of the first through hole and the second through hole so that a projection of the first shielding pattern on the substrate and a projection of the first through hole on the substrate overlap each other and that the projection of the first shielding pattern on the substrate and a projection of the second through hole are completely staggered.

6. The array substrate of claim 4, wherein the array substrate further comprises a second shielding pattern, a second semiconductor pattern, a second gate pattern, and two second source/drain electrode patterns, the second shielding pattern is arranged between the buffer layer and the passivation layer, the second semiconductor pattern is arranged between the passivation layer and the gate insulating layer, the second gate pattern is arranged between the gate insulating layer and the interlayer insulating layer, The second source/drain electrode patterns are arranged on the interlayer insulating layer, the array substrate further comprises a third through hole and a fourth through hole, and the second source/drain electrode patterns are electrically connected to the second semiconductor pattern through the third through hole and the fourth through hole, respectively and are insulated from the second shielding pattern.

7. The array substrate of claim 6, wherein the second semiconductor pattern comprises a second channel zone and two second heavy doping zones arranged at both sides of the second channel zone;

the second source/drain electrode patterns are connected to ceilings of the second heavy doping zones through the third through hole and the fourth through hole, respectively;

a projection of the second shielding pattern on the substrate covers a projection of the second semiconductor pattern on the substrate.

\* \* \* \* \*